United States Patent
Deepak

(10) Patent No.: US 7,302,377 B1
(45) Date of Patent: Nov. 27, 2007

(54) ACCELERATED EVENT QUEUE FOR LOGIC SIMULATION

(75) Inventor: Kumar Deepak, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 640 days.

(21) Appl. No.: 10/388,687

(22) Filed: Mar. 14, 2003

(51) Int. Cl.
 *G06F 17/50* (2006.01)
 *G06F 17/00* (2006.01)
 *G06F 12/06* (2006.01)

(52) U.S. Cl. ............................ 703/14; 703/15; 703/16; 703/17

(58) Field of Classification Search ................ 703/14, 703/16, 15, 17
See application file for complete search history.

(56) References Cited

U.S. PATENT DOCUMENTS 6,324,495 B1 * 11/2001 Steinman ..................... 703/17
6,437,802 B1 * 8/2002 Kenny ......................... 715/723
6,757,794 B2 * 6/2004 Cabrera et al. .............. 711/156
6,961,689 B1 * 11/2005 Greenberg ................... 703/17

OTHER PUBLICATIONS

Thomas H. Cormen et al.; "Introduction to Algorithms"; Twelfth printing, 1994; Copyright 1990 by The Massachusetts Institute of Technology; McGraw-Hill Book Company; pp. 140-146.

* cited by examiner

*Primary Examiner*—Kamini Shah
*Assistant Examiner*—Suzanne Lo
(74) *Attorney, Agent, or Firm*—Kevin T. Cuenot; Michael R. Hardaway

(57) ABSTRACT

An event queue for use with a software-enabled logic simulation tool can include a heap array and a hash table data structure. The heap array can include time slots organized such that each time slot conforms to heap properties which specify, at least in part, that a root node of the array indicates a time slot having a minimum simulation time value. The hash table data structure can include a plurality of entries, wherein selected ones of the entries specify references to at least one of the time slots.

28 Claims, 5 Drawing Sheets

ACCELERATED EVENT QUEUE FOR LOGIC SIMULATION

BACKGROUND OF THE INVENTION

1. Technical Field

The present invention relates to the field of simulation and, more particularly, to the simulation of electronic circuits within logic simulators.

2. Description of the Related Art

A logic simulator is a software tool which is capable of performing functional and timing simulations for digital electronic designs which are written in a hardware description language such as Very High Speed Integrated Circuits Hardware Description Language (VHDL) or Verilog. VHDL, for example, permits hardware designers to define signals at a very high level of abstraction. The abstracted signal representations can be translated to actual pins on a microchip using any of a variety of commercial electronic design automation (EDA) software tools.

Every logic simulator is equipped with an event queue. Future transactions, which refer to pairings of a new value for a particular signal and a time at which the signal assumes this new value, are scheduled to the event queue. The event queue has a listing of time slots, each of which can include one or more transactions pertaining to a particular signal within the design or to a group of signals within the design. The time slot indicates the time at which the referenced transactions are to occur.

During operation, or simulation, the simulation kernel requires that the event queue have the ability to locate and extract the next minimum time slot for which a transaction has been scheduled. Additionally, as transactions continue to arrive into the event queue during simulation, these new transactions must be scheduled. Accordingly, these new transactions are scheduled to the event queue by searching the event queue to determine whether a time slot already exists for this new transaction or one must be created.

Thus, in order to achieve suitable simulation performance, the event queue of a logic simulation tool must have the ability to quickly locate the next minimum time slot of all the time slots stored within the event queue, extract the minimum time slot quickly, insert a new time slot quickly, and search for an identified time slot. Conventional simulation tools utilize a priority queue as the event queue. The priority queue typically is implemented using a single data structure. In consequence, such event queues often perform well with respect to only one of the tasks an event queue must perform. This task varies with the particular data structure used to implement the priority queue.

In illustration, some conventional event queues are implemented using a binary tree data structure. A binary tree data structure provides for fast, efficient searching, insertion, and extraction, typically requiring a time period on the order of log N, where N is the total number of time slots within the binary tree. However, the log N time is based on a balanced binary tree, but, if used as an event queue, a binary tree typically is not going to be balanced. Instead, binary trees can degenerate into standard listings where most, if not all of the operations, require a time period on the order of N rather than log N.

More complex tree data structures, for example red and black trees, can provide log N complexity for the above operations and also maintain balance in the tree data structure. The amount of overhead needed for maintaining this balance, however, is significant and does little with respect to minimizing the time and resources necessary when utilizing this data structure.

Taking another example, hash table data structures also can be used to implement event queues. A hash table data structure provides for fast, efficient search for an identified time slot. This search time is typically about constant and generally does not increase as the number of entries increases. Hash table data structures, however, are not an efficient mechanism for locating the next minimum time slot. The complexity for locating and then extracting next minimum time slot from a hash table implementation is of the order of N.

The reliance upon logic simulation tools continues to increase with the complexity of logic designs. Accordingly, the aforementioned inefficiencies with respect to conventional event queues can significantly increase the time required to thoroughly test logic designs, thereby reducing simulation performance. What is needed is an improved event queue design and method for using the same.

SUMMARY OF THE INVENTION

The present invention provides a method, system, and apparatus for event queue processing within a software-based logic simulation tool. The exemplary embodiment of the present invention provides an event queue for such logic simulation tools as well as a method for using the same. The event queue incorporates two different data structures, each suited for a different task. Accordingly, rather than using a single data structure which may be ideally suited for a particular function, but has substandard performance characteristics with regard to another needed event queue function, the exemplary embodiment of the present invention uses a plurality of data structures. Using a plurality of data structures for implementing an event queue allows each data structure to be used for the task or tasks for which the data structure is most suited or more efficient at performing.

Accordingly, the exemplary embodiment of the present invention can realize significant gains in performance over conventional event queues. According to the exemplary embodiment of the present invention, a hash table data structure can be used in combination with a heap array. The hash table data structure can include an array of pointers to the time slot structure. The heap array can include pointers to the same time slots as entered in the hash table which are arranged such that time components of the time slots follow heap properties. This arrangement can provide an event queue for which the search time for locating a minimum time slot is constant, and in fact, requires little or no additional time as the time slot is located at the first index of the heap array. And, extracting the minimum time slot and adjusting the heap array to maintain the heap properties takes place during a time period on the order of log N.

Searching for any time slot can require a constant time as searching is done using the hash table data structure. Thus, the search time does not increase as N increases. As searches are very frequent during logic simulation, efficiencies in these operations can result in a significant reduction in the amount of time needed for processing and overhead. Adding a new time slot can require approximately log N time. Accordingly, the exemplary embodiment of the present invention allows addition and deletion times to be maintained at approximately log N time while also maintaining the search efficiency.

One aspect of the present invention includes an event queue for use with a software-enabled logic simulation tool.

The event queue can include an heap array component including time slots organized such that each time slot conforms to heap properties which specify, at least in part, that a root node of the heap array indicates a time slot having a minimum simulation time value. The event queue further can include a hash table data structure component having a plurality of entries, wherein selected ones of the entries specify references to at least one of the time slots.

Notably, selected ones of the entries can specify references to doubly linked lists of the time slots. Other ones of the entries can specify a null value indicating that no time slot is associated with the entry. Additionally, particular ones of the entries can be accessed using a hash function which utilizes a total number of entries in the hash table and the time value of the time slot as operators. For example, the hash function can be the time value of the time slot to be located mod the total number of entries in the hash table.

Another embodiment of the present invention further includes means for extracting the time slot indicated by the root of the heap array as a next time slot to be processed during simulation of a logic design. In the case where each time slot of the heap array has at least one parameter, the event queue further can include means for modifying the at least one parameter of selected ones of the time slots of the heap array according to the heap properties responsive to at least one of an addition of a new time slot to the heap array and a deletion of an existing time slot from the heap array.

The event queue also can include means for removing a time slot from a doubly linked list of the hash table data structure and means for adjusting the doubly linked list to maintain continuity. According to one embodiment of the present invention, the heap array can be used to identify the time slot having the minimum simulation time value while the hash table data structure can be used to locate particular ones of the time slots.

Another aspect of the present invention can include an event queue for use with a software-enabled logic simulation tool. The event queue can include means for receiving a plurality of time slots within the event queue and means for loading the plurality of time slots into a heap array of the event queue. The event queue also can include means for arranging the heap array such that an ordering of the time slots within the heap array conforms to heap properties specifying, at least in part, that the time slot having a minimum simulation time value is located at a root node of the heap array. The event queue further can include means for loading the plurality of time slots into a hash table data structure of the event queue according to a hash function. Notably, the heap array can be used to identify a time slot having the minimum simulation time value while the hash table data structure can be used to locate particular ones of the time slots.

Another aspect of the present invention can include a method of organizing an event queue within a software-enabled logic simulation tool. The method can include receiving a plurality of time slots within the event queue and loading the plurality of time slots into a heap array of the event queue. The heap array can be configured such that an ordering of the time slots within the heap array conforms to heap properties specifying, at least in part, that the time slot having a minimum simulation time value is located at a root node of the heap array. The plurality of time slots can be loaded into a hash table data structure of the event queue according to a hash function. As noted, the heap array can be used to identify a time slot having the minimum simulation time value and the hash table data structure can be used to locate particular ones of the time slots.

The method further can include determining a selected entry in the hash table data structure corresponding to a particular one of the plurality of time slots and, if the selected entry specifies a non-null value, time slots at a memory location indicated by the selected entry in the hash table data structure can be identified. If the selected entry specifies a null value, the method can include determining that the particular one of the plurality of time slots does not exist. If more than one time slot is referenced by the selected entry, the method can include traversing a doubly linked list including the one or more time slots to locate the particular one of the plurality of time slots.

According to one embodiment of the present invention, the hash function can utilize a total number of entries in the hash table data structure and a time value of the time slot as operators. For example, the hash function can be the time value of the time slot to be located mod the total number of entries in the hash table data structure.

The method also can include extracting a time slot indicated by the root node of the heap array as a next time slot to be processed during simulation of a logic design. Further, at least one parameter of the heap array can be modified according to the heap properties responsive to at least one of an addition of a new time slot to the heap array and a deletion of an existing time slot from the heap array. Additionally, at least one of inserting a new time slot into the hash table data structure and removing an existing time slot from the hash table data structure can be performed.

BRIEF DESCRIPTION OF THE DRAWINGS

There are shown in the drawings embodiments which are presently preferred, it being understood, however, that the invention is not so limited to the precise arrangements and instrumentalities shown.

FIGS. 6-1, 6-2 and 6-3 are schematic diagrams illustrating the addition of a time slot to the heap array in accordance with the present invention.

DETAILED DESCRIPTION OF THE INVENTION

The present invention provides a method, system, and apparatus for event queue processing within a software-based logic simulation tool. While from an outside perspective the event queue of the exemplary embodiment of the present invention appears as a single entity, the event queue includes multiple data structures. In particular, the exemplary embodiment of the present invention utilizes a heap array, which is organized to conform to heap properties and a hash table data structure. Each data structure is accessed to perform those operations for which the data structure is suited to perform.

Figure 1:
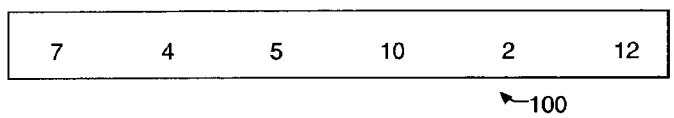
FIG. 1 is a schematic diagram illustrating unordered time slots within an event queue.

FIG. 1 is a schematic diagram illustrating unordered time slots within an event queue 100. As shown, the event queue includes time slots of 7, 4, 5, 10, 2, and 12 representing times, or having time values, of 7 nanoseconds (ns), 4 ns, 5 ns, 10 ns, 2 ns, and 12 ns. Each time slot serves as a place holder in time with which various transactions occurring in the logic design can be associated. Any transaction associated with a particular time slot is said to occur at the time value associated with the time slot. Thus, a transaction associated with 4 ns is said to occur 4 ns after some reference time. The time slots within the event queue 100 have not yet been ordered. For example, the time slots can be loaded in the event queue in the order in which the time slots arrive at the event queue. This initial ordering, however, is not necessarily the ordering in which the time slots must be extracted in the course of simulating the logic design.

Figure 2:
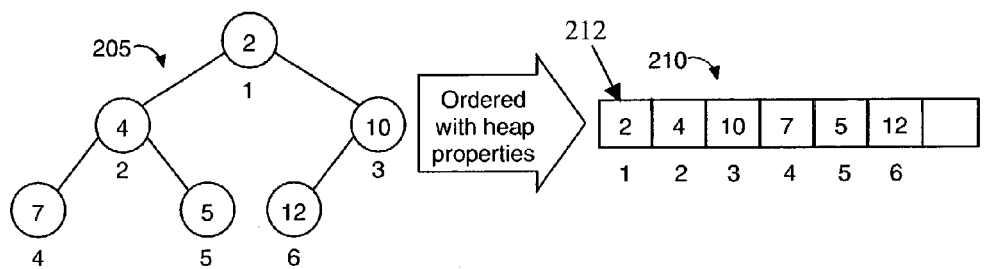
FIG. 2 is a schematic diagram illustrating a heap array portion of an event queue which is organized using heap properties in accordance with the inventive arrangements disclosed herein.

FIG. 2 is a schematic diagram illustrating a heap array 210 portion of an event queue which is organized using heap properties in accordance with the inventive arrangements disclosed herein. A heap data structure 205 is shown for purposes of illustration to demonstrate the manner in which the heap array 210 is to be organized. For example, the heap data structure 205 has been organized such that the root node, in this case the time slot of time value 2 ns, is the minimum simulation time slot. In other words, the root node indicates the time slot of the lowest time value which is to be accessed next during the course of simulating a logic design.

The heap data structure 205, as shown, is organized such that for a given heap array index i, the left child node is at index 2i, the right child node is at index 2i+1, and the parent node is at index i/2. The numbers immediately beneath each node of the heap data structure 205 indicate the index of the node immediately above. Notably, a given node in the heap data structure 205 always has a time value which is less than the time values in any of that node's child nodes. This relationship provides that the time slot with the minimum simulation time value is at the root of the heap data structure 205, namely index 1.

According to the exemplary embodiment of the present invention, the time slots of the event queue can be ordered using the heap array 210 having heap properties. As shown, the heap array 210 has an ordering derived from the heap data structure 205. The indices of each time slot have been indicated beneath the time slots within the heap array 210. For example, the time slots are organized from left to right with the root node first, time slot 2, followed by the nodes from the second level of the heap data structure 205, particularly time slots 4 and then 10. Following time slots 4 and 10 are the nodes from the bottom level of the heap data structure 205, in this case time slots 7, 5, and then 12. Accordingly, the properties of the heap data structure are utilized to organize the heap array 210 and, further, can be used to maintain this organization.

The time slots can be represented as objects which include parameters for representing the heap properties including, for example, the indexing used by the heap data structure 205. Accordingly, the heap array 210 can be reordered simply by re-annotating the indices of the time slot object rather than reordering the entire heap array 210. The heap array 210 can be used for rapidly identifying and extracting the time slot with the minimum simulation time value. Although the heap array 210 is shown with only seven locations, those skilled in the art will recognize that the heap array 210 can include more or less locations as may be required for simulating logic designs of varying complexity.

"Heapify" is a procedure that is used to build and maintain a heap, including a heap array. Let A(i) represent, for example, a time slot value in heap array 210, where i is the index in the heap array. For example A(3)=10 and i=3 in FIG. 1. Let Left(i) be the left child node of A(i) and Right(i) be the right child node of A(i). For example, the left child node of A(1)=2 is Left(1)=A(2) (i.e., 4) and the right child node of A(1)=2 is Right(1)=A(3) (i.e., 10). Assuming that the binary trees rooted at Left(i) and Right(i) are heaps and that A(i) is larger than its children, then the heap property is violated (where the heap property is that the value of a parent node, i.e., A(i), is less than or equal to its children, i.e., Left(i) and Right(i)). Heapify is a recursive routine that moves A(i) down in the heap so that a subtree rooted at A(i) is a heap. It takes on the order of log N time to re-heapify a heap after there is an insertion or deletion from the heap. The initial building of a heap from an unordered list uses the heapify function and takes linear time (on the order of N). More details can be found in the textbook "Introduction to Algorithms" by Thomas H. Cormen, et. al., Copyright 1994, MIT Press, pp. 140-146, which is herein incorporated by reference.

Figure 3:
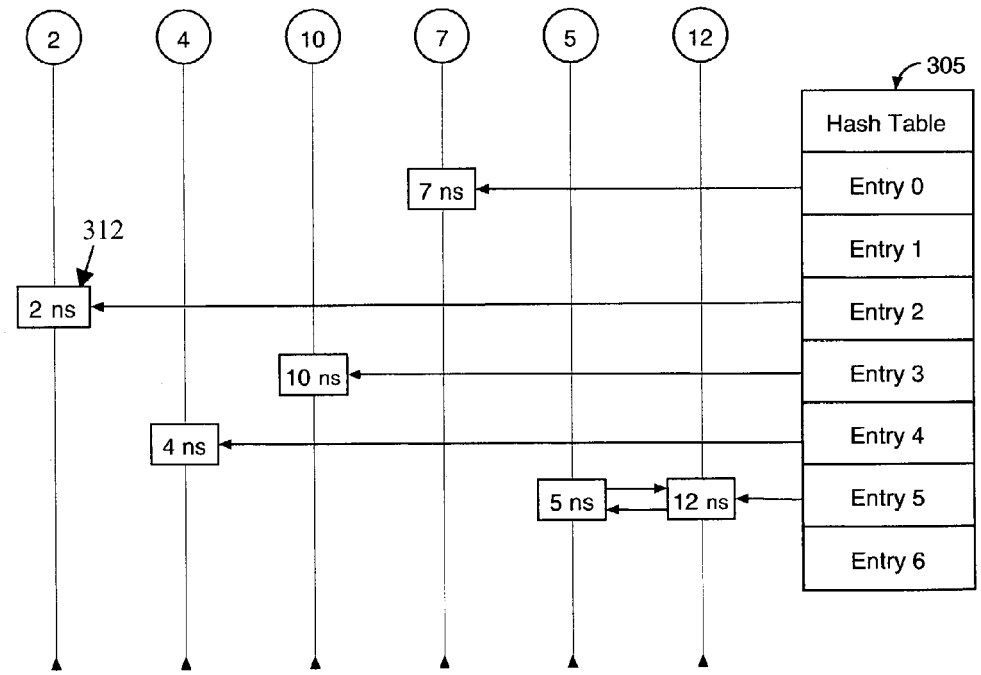
FIG. 3 is a schematic diagram illustrating operation of the hash table data structure in accordance with the inventive arrangements disclosed herein.

FIG. 3 is a schematic diagram illustrating operation of the hash table data structure 305 in accordance with the inventive arrangements disclosed herein. It should be appreciated that although the heap array and the hash table data structure of the present invention are shown in separate figures, the two data structures are to be used cooperatively with one another and that an event queue according to the present invention is formed of both the heap array and the hash table data structure.

Referring to FIG. 3, the hash table data structure 305 includes 7 entries. The hash table data structure 305, similar to the heap array of FIG. 2, can include any number of entries which may be required for purposes of simulating logic designs of varying complexity. According to one aspect of the present invention, the hash table data structure 305 can be configured to include a number of entries equivalent to a prime number. This technique has been shown to avoid hashing collisions and therefore can minimize the need for doubly linked lists with respect to the time slots, for example, when more than one time slot is referenced by the same entry of the hash table data structure 305.

Although utilization of a prime number of total hash table data structure entries can minimize collisions, the situation still can arise where more than one time slot is to be referenced by the same entry within the hash table data structure 305. Entries 5 and 12 of the hash table data structure 305 exemplify this case. The time slots can be associated with one another through doubly linked lists such that a linked list can be navigated whether moving from left to right or right to left with respect to FIG. 3. In addition, in one embodiment, each entry in the heap array 210 of FIG. 2 has a link to the corresponding entry in the hash table data structure 305. For example, time slot 2 (entry 212) in heap array 210 has a pointer to time slot 2 (entry 312) in hash table data structure 305. Hence if entry 212 is deleted in heap array 210, there is a corresponding deletion of entry 312 in hash table data structure 305 without the need for a search of the hash table.

The hash function utilized for the hash table data structure 305 of FIG. 3 utilizes the function (time value) mod (hash table data structure size). For example, using this hash function, the time slot of time value 7 ns can be referenced by entry 0 of the hash table data structure 305 and the time slots having time values of 2 and 10 can be referenced by entry 2 of the hash table data structure 305. Those skilled in the art, will recognize, however, that any of a variety of different hash functions can be used and that the present invention is not so limited.

Figure 4:
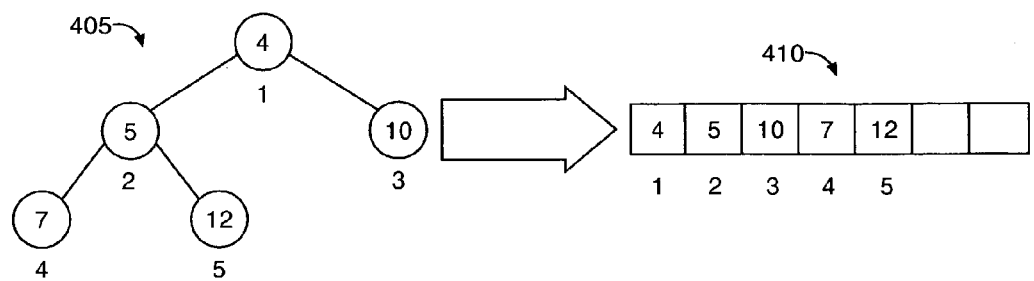
FIG. 4 is a schematic diagram illustrating the operation of the heap array after the time slot having the minimum simulation time value has been extracted in accordance with the inventive arrangements disclosed herein.

FIG. 4 is a schematic diagram illustrating the operation of the heap array after the time slot having the minimum simulation time value has been extracted. As was the case in FIG. 2, the heap data structure 405 is shown for purposes of illustration only. The heap data structure 405 represents the state of the data structure after the indices have been adjusted and the time slot with the minimum simulation time, in this case 2 ns, has been extracted. The ordering of the time slots using the heap properties previously described is illustrated by the heap array 410. The indices of each node are indicated beneath the various nodes of the heap data structure 405 and beneath each time slot in the heap array 410.

As shown, the root of the heap data structure 405 is located first within the heap array 410. The second row of the heap data structure 405 is located next within the heap array 410. Finally, the last row of the heap data structure 405 is placed next. As noted, the heap array 410 can be ordered by adjusting the indices associated with each time slot. Notably, the deletion of the root node of the heap array 410 and the adjustment of the heap properties of the heap array 410 require an amount of time on the order of log N, where N is the total number of entries in the heap array 405.

More specifically after the extraction (deletion) of time slot 2 in heap array 210 of FIG. 2, the heap array is heapified using a variation of the above "heapify procedure" to yield heap array 410 of FIG. 4. For example, using the heap data structure 205 as an illustration, after node with index 1 having time slot 2 (which for simplicity is called node 2) is deleted, node 4 is smaller than node 10, and moves to the root of the tree. Node 5 is smaller than node 7 and takes the place node 4 had before being moved. Node 12 no longer can be at index 6 (since the maximum index is 5) and is moved to the right child node of node 5. The moves have been done to maintain the heap property (the time slot value of a parent node is less than or equal to its two children).

Figure 5:
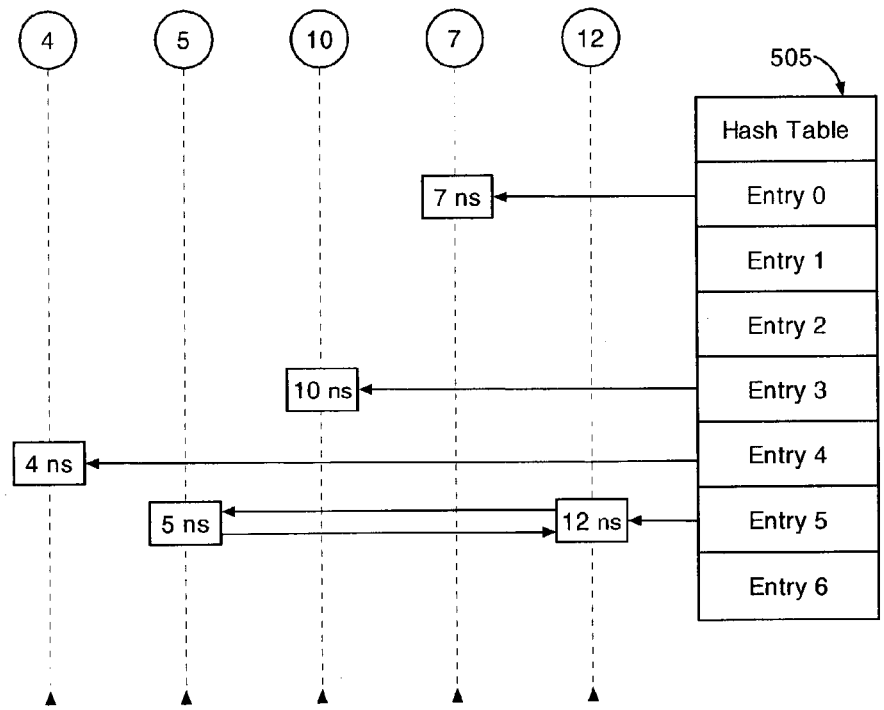
FIG. 5 is a schematic diagram illustrating the state of the hash table after the time slot having the minimum simulation time value has been extracted in accordance with the present invention.

FIG. 5 is a schematic diagram illustrating the state of the hash table after the time slot having a time value of 2 ns has been removed. As the time slot which had the minimum simulation time value was located within a doubly linked list, deletion of that time slot can be performed rapidly by adjusting the references of time slots which neighbored the deleted time slot to effectively skip the deleted time slot so that the doubly linked list maintains continuity. Notably, prior to identifying or deleting a particular time slot, the target time slot must be located within the hash table data structure 505. A target time slot can be located rapidly by using the hash function and then navigating the doubly linked list to the target time slot. Still, for extraction of a minimum time slot, no hashing is needed to search for the minimum time slot as the time slot is at the first index of the heap array. Once accessed from the heap array, the time slot can be taken out from the hash table by simple pointer manipulation resulting in almost no extra cost in deletion for maintaining two data structures.

When the hash table data structure 505 is searched, if the entry within the hash table data structure 505 specifies a null value, then no such time slot exists in the event queue. If, however, the hashed location contains a non-null pointer to memory location, then a doubly linked list of time slots is assumed to begin at the memory location specified by the pointer.

Figures 1, 6:
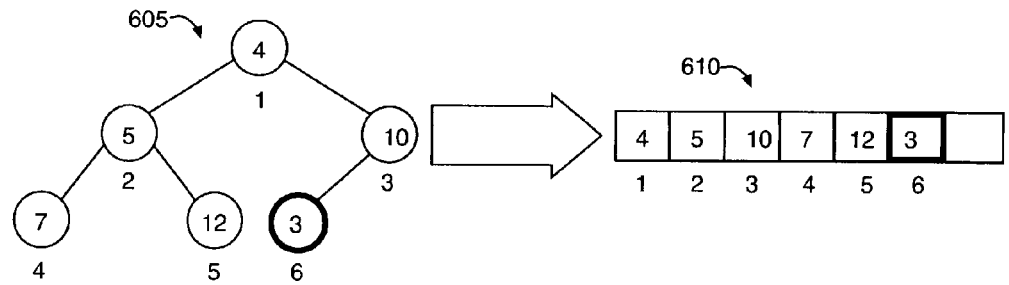

FIGS. 6-1, 6-2 and 6-3 are schematic diagrams illustrating the addition of a time slot to the heap array 610 in accordance with the present invention. As shown, FIGS. 6-1 illustrates the operation of adding a time slot having a time value of 3 ns to the heap array 610. Again, as was previously the case, the heap data structure 605 is shown for purposes of illustration only. Accordingly, the time slot of time value 3 can be added to the end of the heap array 610 (entry 609) at index 6. The indices for nodes of the heap data structure 605 are shown beneath their respective nodes and the indices for the time slots in the heap array 610 are shown beneath their respective time slots.

As FIGS. 6-1 shows node 3 is smaller than node 10 thus violating the heap property (a node must be at least as small as its parent). Hence the heap array needs to be heapified. Another variation of the "heapify procedure" given above is performed in order to heapify the heap array. FIGS. 6-2 shows the heap data structure 606 and heap array 611, after node 3 has been exchanged with node 10 restoring the heap property with respect to the node 3 sub-heap. However, node 3 is less than its parent node 4 and must be exchanged with node 4 to restore the heap property. FIGS. 6-3 shows the final result of the insertion of node 3 and heapifying the heap array, i.e., the new heap data structure 607 and new heap array 612.

Figure 7:
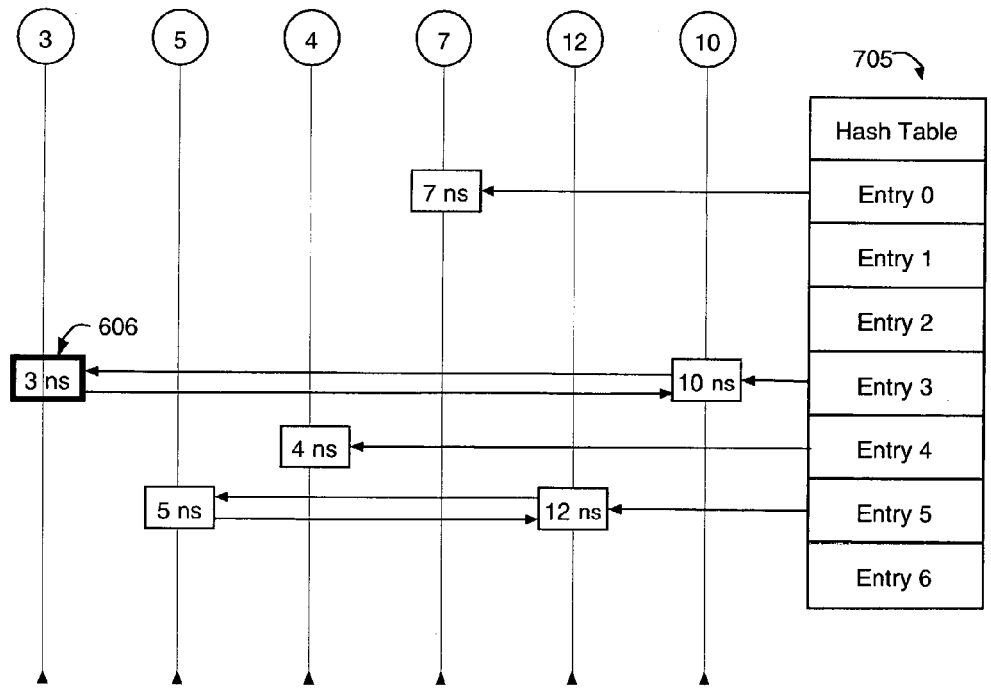
FIG. 7 is a schematic diagram illustrating the addition of a time slot to the hash table data structure in accordance with the present invention.
Figures 2, 6:
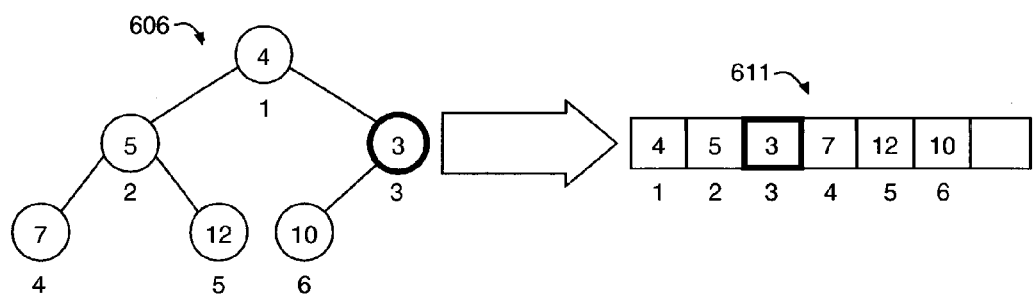
Figures 3, 6:
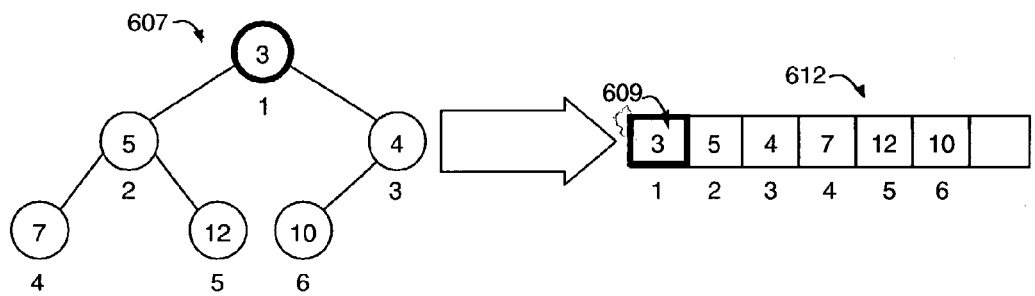

FIG. 7 is a schematic diagram illustrating the addition of the time slot to the hash table data structure 705 in accordance with the present invention. As shown, the new time slot having a time value of 3 ns (entry 606) is hashed into the hash table and added with a doubly linked list to the time slot having time value 10 ns. In addition a link optionally is created between entry 609 of FIGS. 6-3 and entry 606.

Figure 8:
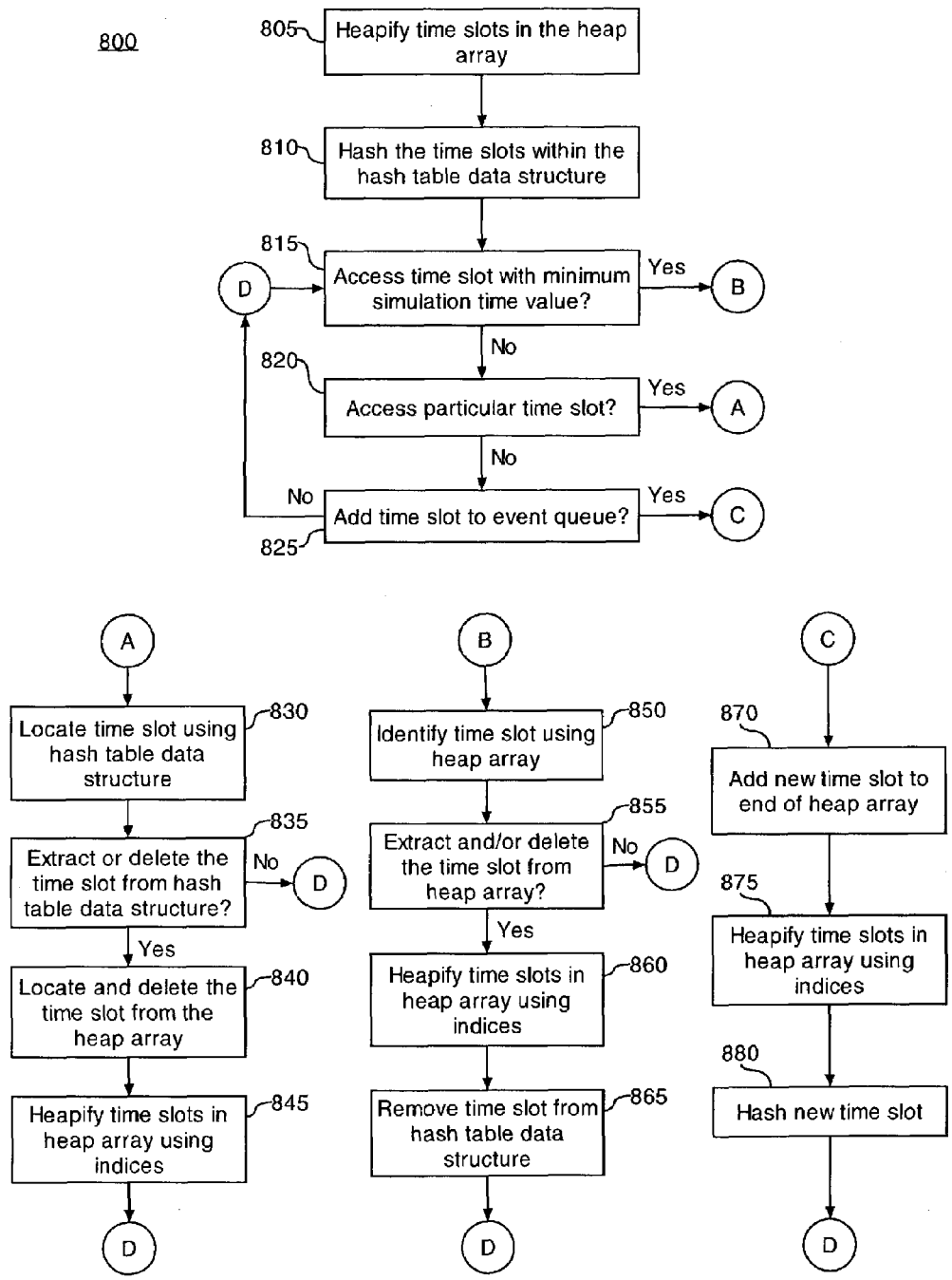
FIG. 8 is a flow chart illustrating a method of accessing the event queue in accordance with an embodiment of the present invention.

FIG. 8 is a flow chart illustrating a method 800 of accessing the event queue in an exemplary embodiment of the present invention. The method 800 can begin in a state wherein a simulation of a logic design has begun. Accordingly, time slots can begin accumulating within the event queue. For purposes of illustration, the method 800 illustrates steps wherein the two data structures forming the event queue, namely the hash table data structure and the heap array are initially organized. Still, it should be appreciated that time slots can be ordered as the time slots arrive within the event queue such that the time slots do not accumulate in an unordered fashion.

In any case, the method 800 can begin in step 805, where time slots within the heap array can be heapified using the heap properties as previously described. After heapifying the heap array, for example by manipulating the indices of the various time slots, the time slot having the minimum simulation time value is located at the beginning of the heap array. In step 810, the time slots can be loaded or hashed into the hash table data structure. More particularly, an entry can be made within the hash table data structure for each time slot, with the noted exception of time slots which, as a result of a data collision, are to be referenced by a same entry. When more than one time slot is referenced by a same entry, the time slots referenced by that same entry can be associated with one another using a doubly linked list.

In step 815, a determination can be made as to whether the kernel has requested the time slot having the next minimum simulation time value. If so, the method can proceed to jump circle B and on to step 850. In step 850, the time slot having the next minimum simulation time value can be readily determined as the time slot at the beginning of the heap array. Accordingly, in step 855, a determination can be made as to whether the identified time slot is to be extracted. If so, the time slot can be extracted and/or removed from the heap array and the method can proceed to step 860. If not, the method can proceed to jump circle D to proceed as necessary.

In step 860, the time slots of the heap array can be heapified by manipulating the indices according to the heap properties. In step 865, the time slot can be quickly located and removed from the hash table data structure. The doubly linked list within which the time slot was located can be updated responsive to the removal of the time slot to maintain continuity. The method can proceed to jump circle D and repeat as necessary.

Proceeding from step 815 to step 820, if the time slot with the next minimum time value is not requested, a determination can be made as to whether the event queue has been tasked with locating a particular time slot. In other words, the kernel of the simulation tool can query the event queue for a particular time slot, for example, which is not the time slot with the next minimum simulation time value. If such a request is made, the method can proceed to jump circle A and continue with step 830. In step 830, the requested time slot can be located quickly using the hash table data structure. The particular time slot can be located by hashing into the hash table data structure, determining the pointer which indicates the memory location where the doubly linked list of one or more time slots for that hash table entry begins, and then traversing the doubly linked list until the desired time slot is determined.

In step 835, a determination can be made as to whether the located time slot is to be extracted and/or deleted from the hash table data structure. If not, the method can proceed to jump circle D and continue as necessary. If so, the located time slot can be extracted and/or deleted. Accordingly, the method can proceed to step 840. As noted, the parameters of the doubly linked list can be altered once the target time slot is removed such that the ordering of the linked list maintains continuity. In step 840, the located time slot can be located and deleted from the heap array. In step 845, the heap array can be heapified to conform with the heap properties by adjusting the indices. After step 845, the method can continue to jump circle D and repeat as may be required.

If the kernel did not request the time slot having the next minimum simulation time value or a particular time slot, the method can proceed to step 825. In step 825, a determination can be made as to whether a request to add a time slot to the event queue has been received from the simulation kernel. If so, the method can continue to jump circle C and on to step 870. In step 870, the new time slot can be added to the end of the heap array. Accordingly, in step 875, the heap array can be heapified by adjusting the indices according to the heap properties. In step 880, the new time slot can be hashed into the hash table data structure and any doubly linked lists can be updated to maintain continuity. After step 880, the method can proceed to jump circle D to continue as may be required.

The method disclosed herein is provided for purposes of illustration only and demonstrates that the hash table data structure of the event queue can be utilized for accessing time slots having a particular time value. For identifying the time slot having the next minimum simulation time value, however, the heap array of the event queue can be used. As a result, any operation performed by the event queue as requested by the simulation kernel can occur in a time period on the order of log N or less, where N is the number of entries within the hash table data structure and also the heap array. In particular, the search for a time slot can be performed in a constant average time.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A computer-based logic simulation tool having an event queue, the event queue comprising:
   a heap array component comprising time slots organized such that each time slot conforms to heap properties which specify, at least in part, that a root node of the heap array indicates a time slot having a minimum simulation time value; and
   a hash table data structure component having a plurality of entries, wherein selected ones of the entries specify references to at least one of the time slots;
   wherein the computer-based logic simulation tool upon receiving a request for a time slot from a simulation kernel of the computer-based logic simulation tool, determines whether the request is for a time slot having a minimum simulation time value, and selects either the heap array component or the hash table data structure component to locate the requested time slot according to whether the request is for a time slot having a minimum simulation time value, and
   wherein the logic simulation tool visually presents a signal representation for a logic design according to data specified in the event queue.

2. The event queue of claim 1, wherein selected ones of the entries specify references to doubly linked lists of the time slots.

3. The event queue of claim 1, wherein other ones of the entries specify a null value indicating that no time slot is associated with the entry.

4. The event queue of claim 1, wherein particular ones of the entries are accessed using a hash function which utilizes a total number of entries in the hash table and the time value of the time slot as operators.

5. The event queue of claim 4, wherein the hash function is the time value of the time slot to be located mod the total number of entries in the hash table.

6. The event queue of claim 1, further comprising:
means for extracting the time slot indicated by the root of the heap array as a next time slot to be processed during simulation of a logic design.

7. The event queue of claim 1, wherein each time slot of the heap array has at least one parameter, the event queue further comprising:
means for modifying the at least one parameter of selected ones of the time slots of the heap array according to the heap properties responsive to at least one of an addition of a new time slot to the heap array or a deletion of an existing time slot from the heap array.

8. The event queue of claim 1, further comprising:
means for removing a time slot from a doubly linked list of the hash table data structure; and
means for adjusting the linked list to maintain continuity.

9. The event queue of claim 1, wherein the processing means selects the heap array component responsive to a request for a time slot having a minimum simulation time value and selects the hash table data structure component responsive to a request for a time slot that does not have a minimum simulation time value.

10. A computer-based logic simulation tool having an event queue comprising:
means for receiving a plurality of time slots within the event queue;
means for loading the plurality of time slots into a heap array of the event queue;
means for arranging the heap array such that an ordering of the time slots within the heap array conforms to heap properties specifying, at least in part, that the time slot having a minimum simulation time value is located at a root node of the heap array;
means for loading the plurality of time slots into a hash table data structure of the event queue according to a hash function;
means for receiving a request for a time slot from a simulation kernel of the computer-based logic simulation tool;
means for determining whether the request is for a time slot having a minimum simulation time value;
means for selecting either the heap array or the hash table data structure to locate a time slot according to whether the request is for a time slot having a minimum simulation time value; and
means for visually presenting a signal representation for a logic design according to data specified within the event queue.

11. A method of organizing an event queue within a software-enabled logic simulation tool comprising:
receiving a plurality of time slots within the event queue;
loading the plurality of time slots into an heap array of the event queue;
heapifying the heap array such that the time slot having a minimum simulation time value is located at a root node of the heap array;
loading the plurality of time slots into a hash table data structure of the event queue according to a hash function;
receiving a request for a time slot from a simulation kernel of the software-enabled logic simulation tool;
determining whether the request is for a time slot having a minimum simulation time value;
selecting either the heap array or the hash table data structure to locate a time slot according to whether the request is for a time slot having a minimum simulation time value; and
visually presenting a signal representation for a logic design according to data specified within the event queue.

12. The method of claim 11, wherein the hash table data structure is selected, the method further comprising:
determining a selected entry in the hash table data structure corresponding to a particular one of the plurality of time slots; and
if the selected entry specifies a non-null value, identifying time slots at a memory location indicated by the selected entry in the hash table data structure.

13. The method of claim 11, wherein the hash table data structure is selected, the method further comprising:
if the selected entry specifies a null value, determining that the particular one of the plurality of time slots does not exist.

14. The method of claim 11, wherein the hash function utilizes a total number of entries in the hash table data structure and a time value of the time slot as operators.

15. The method of claim 14, wherein the hash function is the time value of the time slot to be located mod the total number of entries in the hash table data structure.

16. The method of claim 11, wherein the heap array is selected, the method further comprising:
extracting a time slot indicated by the root node of the heap array as a next time slot to be processed during simulation of a logic design.

17. The method of claim 11, further comprising:
modifying at least one parameter of the heap array according to the heap properties responsive to at least one of an addition of a new time slot to the heap array or a deletion of an existing time slot from the heap array.

18. The method of claim 11, further comprising:
performing at least one of inserting a new time slot into the hash table data structure or removing an existing time slot from the hash table data structure.

19. The method of claim 11, wherein the hash table data structure is selected, the method further comprising:
determining a selected entry in the hash table data structure corresponding to a particular one of the plurality of time slots; and
if more than one time slot is referenced by the selected entry, traversing a doubly linked list including the more than one time slots to locate the particular one of the plurality of time slots.

20. A machine readable storage, having stored thereon a computer program having a plurality of code sections executable by a machine for causing the machine to perform the steps of:
receiving a plurality of time slots within an event queue of a logic simulation tool;
loading the plurality of time slots into a heap array of the event queue;
configuring the heap array such that an ordering of the time slots within the heap array conforms to heap properties specifying, at least in part, that the time slot having a minimum simulation time value is located at a root node of the heap array; and loading the plurality of time slots into a hash table data structure of the event queue according to a hash function;

receiving a request for a time slot from a simulation kernel;

determining whether the request is for a time slot having a minimum simulation time value;

selecting either the heap array or the hash table data structure to locate a time slot according to whether the request is for a time slot having a minimum simulation time value; and visually presenting a signal representation for a logic design according to data specified within the event queue.

21. The machine readable storage of claim 20, wherein the hash table data structure is selected, the machine readable storage further causing the machine to perform the steps of:

determining a selected entry in the hash table data structure corresponding to a particular one of the plurality of time slots; and if the selected entry specifies a non-null value, identifying time slots at a memory location indicated by the selected entry in the hash table data structure.

22. The machine readable storage of claim 20, wherein the hash table data structure is selected, the machine readable storage further causing the machine to perform the step of:

if the selected entry specifies a null value, determining that the particular one of the plurality of time slots does not exist.

23. The machine readable storage of claim 20, wherein the hash function utilizes a total number of entries in the hash table data structure and a time value of the time slot as operators.

24. The machine readable storage of claim 23, wherein the hash function is the time value of the time slot to be located mod the total number of entries in the hash table data structure.

25. The machine readable storage of claim 20, wherein the heap array is selected, the machine readable storage further causing the machine to perform the step of:

extracting a time slot indicated by the root node of the heap array as a next time slot to be processed during simulation of a logic design.

26. The machine readable storage of claim 20, further causing the machine to perform the step of:

modifying at least one parameter of the heap array according to the heap properties responsive to at least one of an addition of a new time slot to the heap array or a deletion of an existing time slot from the heap array.

27. The machine readable storage of claim 20, further causing the machine to perform the step of:

performing at least one of inserting a new time slot into the hash table data structure or removing an existing time slot from the hash table data structure.

28. The machine readable storage of claim 20, wherein the hash table data structure is selected, the machine readable storage further causing the machine to perform the steps of:

determining a selected entry in the hash table data structure corresponding to a particular one of the plurality of time slots; and if more than one time slot is referenced by the selected entry, traversing a doubly linked list including the more than one time slots to locate the particular one of the plurality of time slots.

* * * * *